(12) United States Patent
Wu

(10) Patent No.: US 7,165,233 B2
(45) Date of Patent: Jan. 16, 2007

(54) TEST KET LAYOUT FOR PRECISELY MONITORING 3-FOIL LENS ABERRATION EFFECTS

(75) Inventor: Yuan-Hsun Wu, Tao-Yuan Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 376 days.

(21) Appl. No.: 10/709,075

(22) Filed: Apr. 12, 2004

(65) Prior Publication Data

US 2005/0229147 A1 Oct. 13, 2005

(51) Int. Cl.
*G06F 17/50* (2006.01)
*G01B 9/00* (2006.01)
*G03C 5/00* (2006.01)
*H01L 21/8242* (2006.01)

(52) U.S. Cl. .................. 716/21; 716/19; 356/124; 430/30; 438/243

(58) Field of Classification Search .............. 716/4, 716/19, 21; 438/396, 243; 430/22, 30, 312; 382/211; 356/450, 401, 335, 237.1, 124; 355/67; 257/208.1
See application file for complete search history.

(56) References Cited

U.S. PATENT DOCUMENTS 5,208,648 A * 5/1993 Batchelder et al. ...... 356/237.1
5,220,403 A * 6/1993 Batchelder et al. ......... 356/450
6,163,376 A * 12/2000 Nomura et al. ............ 356/401
6,437,858 B1 * 8/2002 Kouno et al. .............. 356/124
6,489,646 B1 * 12/2002 Jang .......................... 257/296
6,498,364 B1 * 12/2002 Downey et al. ........... 257/303
6,553,562 B1 * 4/2003 Capodieci et al. ........... 716/19
6,720,232 B1 * 4/2004 Tu et al. ..................... 438/396
6,880,135 B1 * 4/2005 Chang et al. ................. 716/4
6,960,503 B1 * 11/2005 Hsu et al. ................... 438/243
7,014,965 B1 * 3/2006 Liao et al. .................... 430/30
7,078,291 B1 * 7/2006 Hsu .......................... 438/249
7,115,935 B1 * 10/2006 Tu et al. ..................... 257/301
2003/0038931 A1* 2/2003 Toyoda et al. ............... 355/67
2004/0159773 A1* 8/2004 Fein et al. ................ 250/208.1
2004/0165778 A1* 8/2004 Cartlidge et al. ........... 382/211
2004/0174512 A1* 9/2004 Toyoda et al. ............... 355/67
2004/0246479 A1* 12/2004 Cartlidge et al. ........... 356/335
2005/0100827 A1* 5/2005 Liao et al. ................... 430/312
2005/0106476 A1* 5/2005 Hassmann et al. ............ 430/5

FOREIGN PATENT DOCUMENTS

EP 1 251 401 A1 10/2002

* cited by examiner

*Primary Examiner*—Paul Dinh
*Assistant Examiner*—Helen Rossoshek
(74) *Attorney, Agent, or Firm*—Winston Hsu

(57) ABSTRACT

An H-shaped test key layout for exclusively monitoring 3-foil lens aberration effects during the fabrication of deep-trench capacitor memory devices is disclosed. The COMA lens aberration effect that used to occur along with the 3-foil lens aberration effect is now eliminated by this test key layout.

5 Claims, 3 Drawing Sheets

TEST KET LAYOUT FOR PRECISELY MONITORING 3-FOIL LENS ABERRATION EFFECTS

BACKGROUND OF INVENTION

1. Field of the Invention

The present invention relates to monitoring of lens aberration during a semiconductor process, and more particularly, to a test key layout for precisely monitoring a 3-foil lens aberration during the fabrication of deep-trench capacitor memory devices by eliminating the COMA aberration.

2. Description of the Prior Art

The relentless drive in the integrated circuit industry toward greater packing density and higher speeds has served as the impetus for optical lithography to reduce printed image sizes. Deep-UV (DUV) lithography has been developed to scale minimum feature sizes of devices on semiconductor chips to sub-micron dimensions. However, all optical projection systems for micro-lithography depart from perfection because of various lens aberrations, especially when large image field size is combined with high numerical aperture (NA). Such aberrations have a variety of effects on lithographic imaging: shifts in the image position, image asymmetry, reduction of the process window, and the appearance of undesirable imaging artifacts. These undesirable effects are sometimes exacerbated through use of resolution enhancement techniques such as phase-shift masks or nonstandard illumination. Consequently, the lens aberration monitoring system plays an important role in the semiconductor processes.

FIG. 1 illustrates an enlarged plan view of a prior art test key layout 10 for monitoring lens aberrations that occur during the fabrication of deep trench (DT) capacitor devices. As shown in FIG. 1, the test key layout 10 comprises a plurality of DT test pairs including pair A, pair B, and pair C. Each of the pairs A, B, and C comprises a left side DT pattern 12 and a right side DT pattern 14. Typically, both of the left side DT pattern 12 and right side DT pattern 14 are rectangular shaped and, as specifically indicated, have a length L and width W. According to the prior art, pair A is disposed at a center position of the test key area 20, the pair B is arranged in 45 degree direction with respect to the pair A in the test key area 20, while the pair C is disposed in 45 degree direction with respect to the pair B. The pair A and pair C are aligned with a reference Y-axis. As seen, pair C is disposed a distance from the pair A along the ±Y-axis. In the indicated circle region 30, i.e., the area substantially surrounded by the pair A and pair B, no DT test pair is disposed therein. Typically, the lens aberration is monitored and evaluated by measuring the image distortion of the DT test pair A.

During the fabrication of DT capacitor devices, the image of the DT test pair A is affected by so-called three-foil (3-foil) aberration. However, in the meantime, the image of the DT test pair A is also affected by COMA aberration when using the same optical system. COMA is an aberration, which results in a point object being turned into a pear-shape or comet shape at the focal plane, most commonly off-axis. It is caused by unequal magnification in different zones of a lens for obliquely incident rays from an off-axis object. It is also known in the art that COMA aberration typically results in asymmetric photoresist image patterns in a photoresist layer for the originally symmetric patterns on the photo mask. The above-described prior art test key layout 10 for monitoring lens aberrations is not capable of abstracting the 3-foil aberration effect. Consequently, there is a need in this industry to provide an improved test key layout for precisely and exclusively monitoring single lens aberration effect, but not combined lens aberration effect, during the fabrication of DT capacitor devices.

SUMMARY OF INVENTION

It is therefore the primary object of the present invention to provide a test key layout for precisely monitoring a 3-foil lens aberration during the fabrication of DT capacitor devices by eliminating the COMA aberration.

According to the claimed invention, an H-shaped test key layout is provided. A first test pattern is substantially disposed at a center position of a test key area. The first test pattern consists of a pair of rectangular shaped symmetric patterns having a length L and a width L. The test key area comprises a reference X-Y coordinate. A second test pattern (corner pattern) is arranged in close proximity to the first test pattern in 45-degree directions with respect to the first test pattern. A third test pattern is disposed next to the first test pattern along an X-axis of the reference X-Y coordinate. The first test pattern, second test pattern, and third test pattern are arranged like capital "H" within the test key area.

It is an unexpected benefit of the present invention that by adding the third test pattern next to first test pattern along the reference X-axis, the COMA aberration effect can be eliminated, thereby exclusively monitoring the 3-foil aberration effect during the fabrication of DT capacitor devices.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a test key layout or pattern, which may be made on a photomask or be transferred through the photomask containing the test key layout to a photoresist layer coated on a wafer. The present invention is particularly suited for monitoring the 3-foil aberration during the fabrication of DT capacitor devices with an optical lithographic system utilizing a high numerical aperture (NA) such as NA>0.7 and an off-axis illumination such as QUASAR 90, but not limited thereto.

Figure 1:
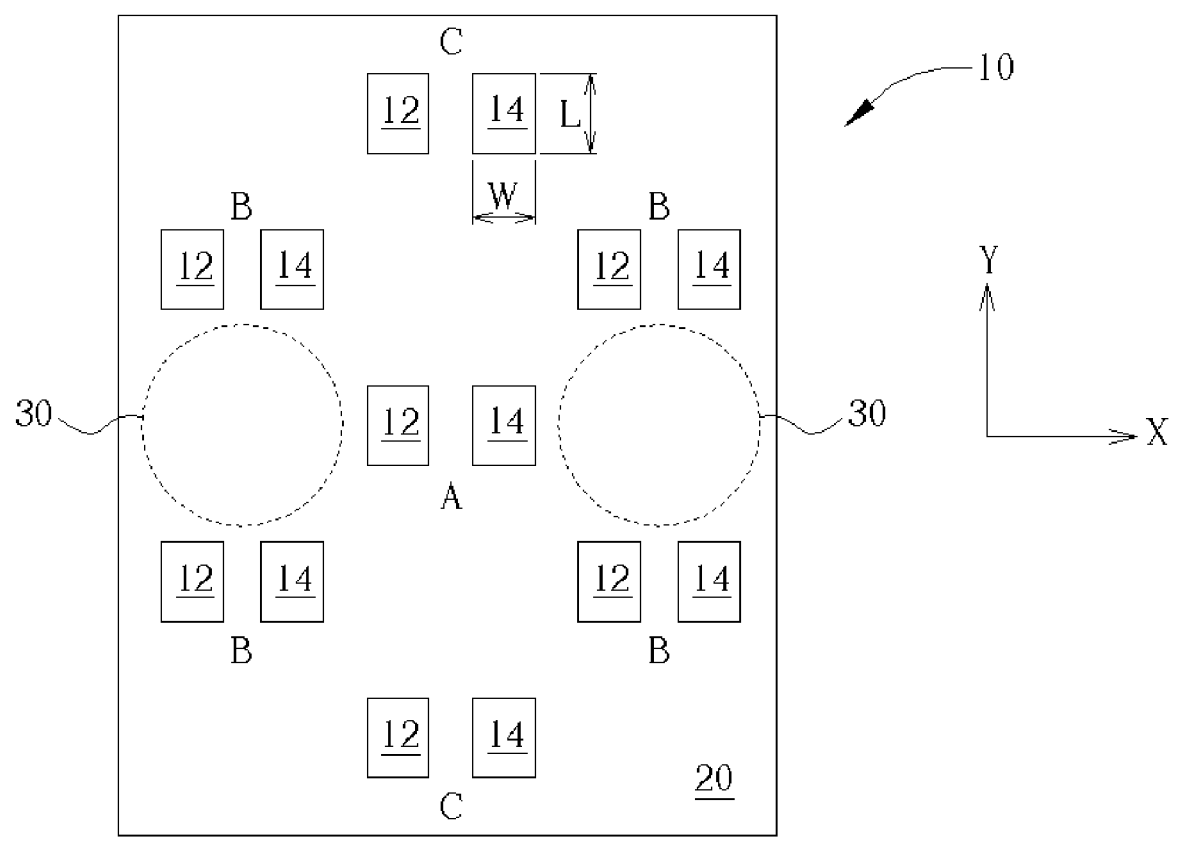
FIG. 1 is an enlarged plan view of a conventional test key layout for monitoring lens aberrations that occur during the fabrication of DT capacitor devices.
Figure 2:
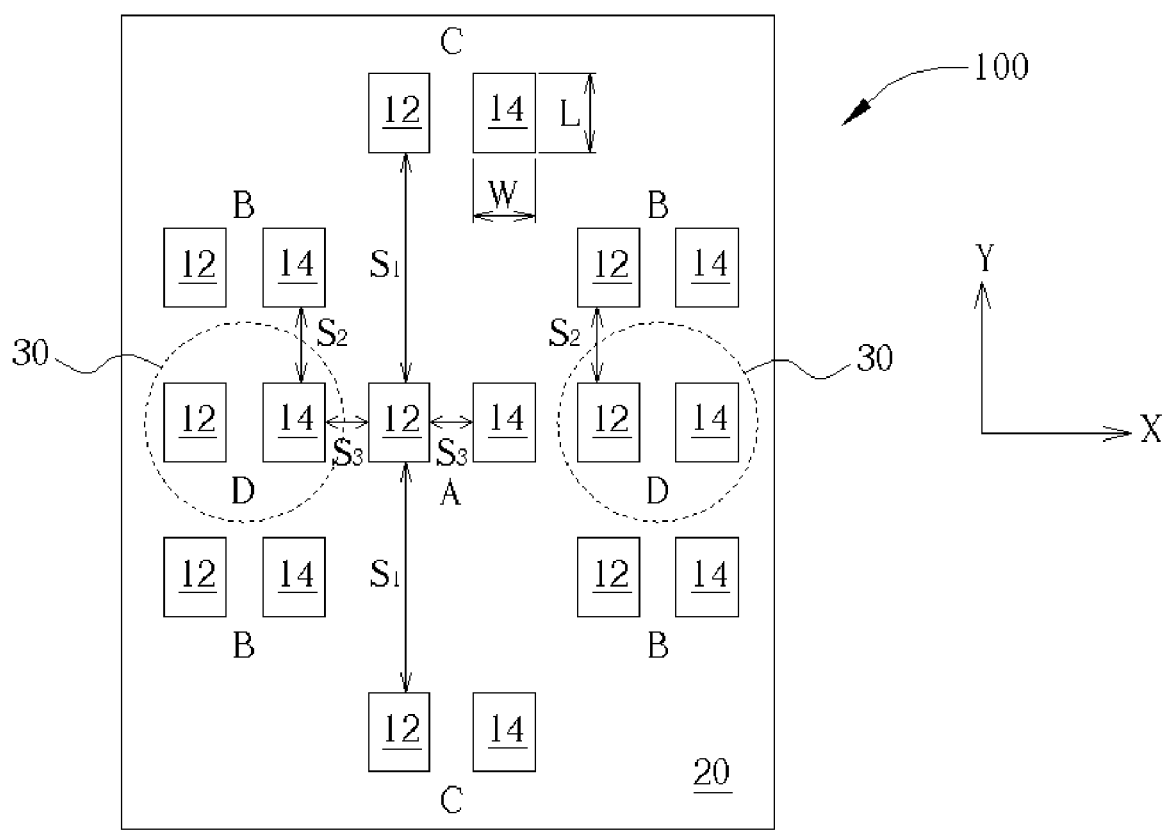
FIG. 2 is a schematic plan view of a test key layout for monitoring lens aberrations during the fabrication of DT capacitor devices according to the first preferred embodiment of this invention.

Please refer to FIG. 2. FIG. 2 is a schematic plan view of a test key layout 100 for monitoring lens aberrations during the fabrication of DT capacitor devices according to the first preferred embodiment of this invention, wherein like numerals designate the same or similar regions or elements. As shown in FIG. 2, the test key layout 100 comprises a plurality of DT test pairs including pair A, pair B, pair C and pair D arranged in test key area 20. Generally, the test key area 20 is defined on a scribe line of a wafer or on peripheral region of a die (not shown). Each of the pairs A, B, C and D comprises a left side DT pattern 12 and a right side DT pattern 14. Both of the left side DT pattern 12 and right side DT pattern 14 are rectangular shaped and, as specifically indicated, have a length L and width W. According to the preferred embodiment, the dimension (length L and width W) of the left side DT pattern 12 and right side DT pattern 14 and the dimension of the DT capacitors made in the memory array are substantially the same. By way of example, for a 0.11-micron process, the length L of the left side DT pattern 12 and right side DT pattern 14 is 220 nm, and the width W of the left side DT pattern 12 and right side DT pattern 14 is 110 nm. On a photomask, the left side DT pattern 12 and right side DT pattern 14 are opaque regions. Light irradiating the test key area 20 passes through the photomask substrate except the opaque left side DT pattern 12 and right side DT pattern 14.

According to the present invention, the pair A is substantially disposed at a center position of the test key area 20, the pair B is arranged in 45 degree direction with respect to the pair A in the test key area 20, while the pair C is substantially disposed in 45 degree direction with respect to the pair B. The pair A and pair C are aligned with a reference Y-axis. As seen in FIG. 2, the pair C is disposed a distance (spacing) $S_1$ from the pair A along the ±Y-axis (supposing that the pair A is located on the coordinate origin of the reference X-Y axis coordinate system). In accordance with the preferred embodiment of this invention, the length L of the left side DT pattern 12 and right side DT pattern 14 is three times the spacing $S_1$ between the pair A and pair C (i.e., $S_1$=3L). In the indicated circle region 30, i.e., the area substantially surrounded by the pair A and pair B, DT test pair D is disposed therein. The pair A and pair D are aligned with a reference X-axis. As seen in FIG. 2, the pair D is disposed a distance from the pair A along the ±X-axis.

The pair D is disposed a distance $S_2$ from the pair B. In accordance with the preferred embodiment of this invention, the length L of the left side DT pattern 12 and right side DT pattern 14 is substantially equal to the spacing $S_2$ between the pair B and pair D (i.e., $S_2$=L). As specifically indicated, the spacing between the left side DT pattern 12 of the pair A and the right side DT pattern 14 of the pair D is denoted as "$S_3$". In accordance with the preferred embodiment of this invention, the spacing $S_3$ is substantially equal to the width W of the left side DT pattern 12 and right side DT pattern 14 (i.e., $S_3$=W). The arrangement of the pairs A, B, and D is somewhat like a capital "H" within the test key area 20 (H-shaped layout).

It is an unexpected benefit of the present invention that by adding the DT test pair D inside the circle regions 30 next to the pair A, the COMA aberration effect can be eliminated, thereby enabling exclusively monitoring of the 3-foil aberration effect during the fabrication of DT capacitor devices.

Figure 3:
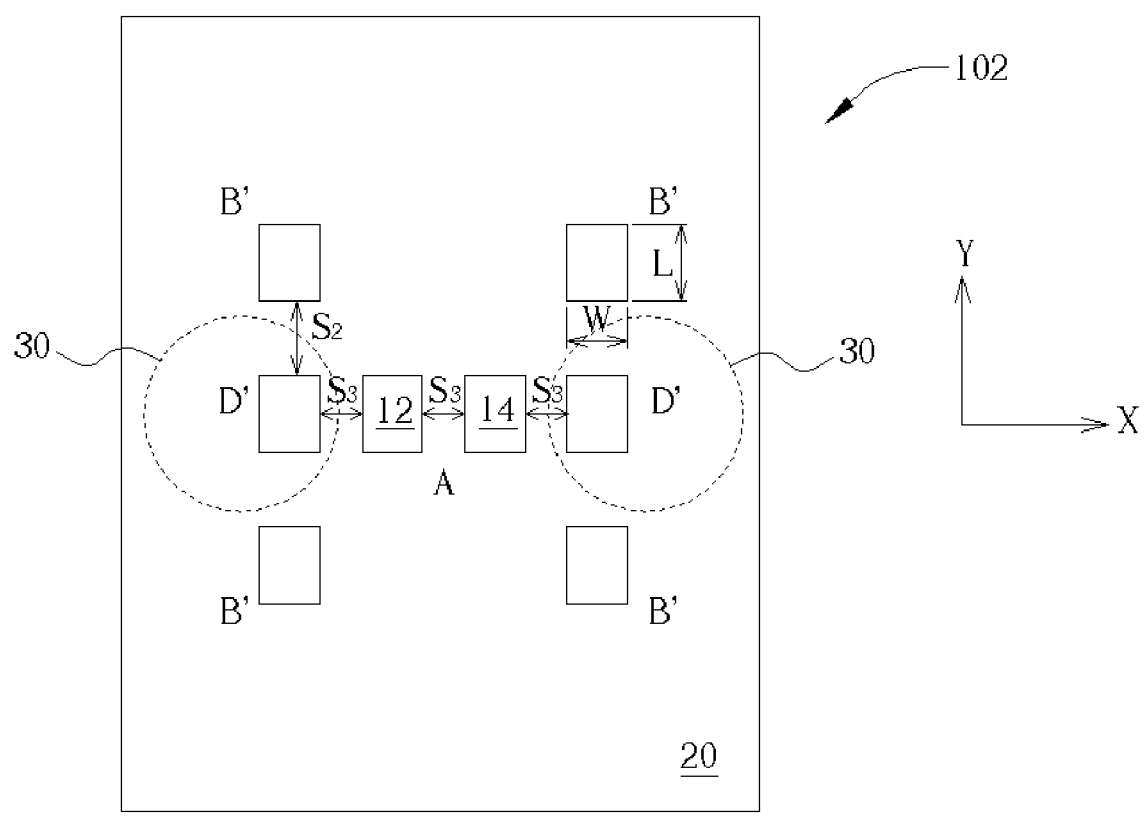
FIG. 3 is a schematic plan view of a test key layout for monitoring lens aberrations during the fabrication of DT capacitor devices according to the second preferred embodiment of this invention.

Please refer to FIG. 3. FIG. 3 is a schematic plan view of an H-shaped test key layout 102 for monitoring 3-foil lens aberration during the fabrication of DT capacitor devices according to the second preferred embodiment of this invention, wherein like numerals designate the same or similar regions or elements. Comparing to the first preferred embodiment, the second preferred embodiment as depicted in FIG. 3 is a further simplified version. As shown in FIG. 3, the H-shaped test key layout 102 comprises a central DT test pair A, and single DT test pattern B" and single DT test pattern D" arranged in the test key area 20. Generally, the test key area 20 is defined on a scribe line of a wafer or on peripheral region of a die (not shown).

The central DT test pair A comprises a left side DT pattern 12 and a right side DT pattern 14. The left side DT pattern 12 and right side DT pattern 14, the single DT test pattern (corner pattern) B' and single DT test pattern (COMA eliminating pattern) D' are all rectangular shaped and, as specifically indicated, have a length L and width W. According to the preferred embodiment, the dimension (length L and width W) of the left side DT pattern 12 and right side DT pattern 14 and the dimension of the DT capacitors made in the memory array are substantially the same. By way of example, for a 0.11-micron process, the length L is about 220 nm, and the width W is about 110 nm. On a photomask (not shown), the left side DT pattern 12, right side DT pattern 14, the single DT test pattern B' and single DT test pattern D' are opaque regions. Light irradiating the test key area 20 passes through the transparent photomask substrate except the opaque regions.

According to the second preferred embodiment of the present invention, the DT test pair A is substantially disposed at a center position of the test key area 20, the single DT test pattern B' is arranged in 45 degree direction with respect to the DT test pair A in the test key area 20. In the circle region 30, i.e., the area substantially defined by the DT test pair A and corner pattern B', single DT test pattern D' is disposed therein. The DT test pair A and single DT test pattern D' are aligned with a reference X-axis. As seen in FIG. 3, the single DT test pattern D' is disposed a distance $S_3$ from the pair A along the ±X-axis. In accordance with the second preferred embodiment of this invention, the length L is substantially equal to the spacing $S_2$ (i.e., $S_2$=L). The spacing $S_3$ is substantially equal to the width W (i.e., $S_3$=W). The arrangement of the pair A, single DT test pattern B', and single DT test pattern D' is some-what like a capital "H" within the test key area 20 (H-shaped layout).

Those skilled in the art will readily observe that numerous modification and alterations of the present invention may be made while retaining the teachings of the invention. Accordingly, the above disclosure should be construed as limited only by the metes and bounds of the appended claims.

What is claimed is:

1. A test key layout, comprising:
  a first test pattern substantially disposed at a center position of a test key area, wherein said first test pattern consists of a pair of rectangular shaped symmetric patterns having a length L and a width W, and wherein said test key area comprises a reference X-Y coordinate;
  a second test pattern arranged in proximity to said first test pattern in 45 degree directions with respect to said first test pattern;
  a third test pattern disposed next to first test pattern along an X axis of said reference X-Y coordinate; and
  a fourth test pattern disposed a distance $S_1$ from said first test pattern along a Y-axis of said reference X-Y coordinate wherein $S_1$=3L.

2. The test key layout of claim 1 wherein said test key layout is made on a photomask comprising an array of deep-trench (DT) capacitor patterns, and wherein said rectangular shaped symmetric patterns have a dimension that is substantial equal to dimension of said DT capacitor patterns.

3. The test key layout of claim 1 wherein said test key layout is capable of exclusively monitoring 3-foil aberration effect without affected by co-existed COMA aberration effect.

4. A test key layout, comprising:
a first test pattern substantially disposed at a center position of a test key area, wherein said first test pattern consists of a pair of rectangular shaped symmetric patterns having a length L and a width W, and wherein said test key area comprises a reference X-Y coordinate;
a second test pattern arranged in proximity to said first test pattern in 45 degree directions with respect to said first test pattern; and
a third test pattern disposed next to said first test pattern along an X axis of said reference X-Y coordinate;
a fourth test pattern disposed a distance $S_1$ from said first test pattern along a Y-axis of said reference X-Y coordinate,
wherein said second test pattern is disposed a distance $S_2$ from said third test pattern and $S_2=L$.

5. A test key layout, comprising:
a first test pattern substantially disposed at a center position of a test key area, wherein said first test pattern consists of a pair of rectangular shaped symmetric patterns having a length L and a width W, and wherein said test key area comprises a reference X-Y coordinate;
a second test pattern arranged in proximity to said first test pattern in 45 degree directions with respect to said first test pattern; and
a third test pattern disposed next to said first test pattern along an X axis of said reference X-Y coordinate;
a fourth test pattern disposed a distance $S_1$ from said first test pattern along a Y-axis of said reference X-Y coordinate,
wherein said third test pattern is disposed a distance $S_3$ from said first test pattern and $S_3=W$.

* * * * *